(12) United States Patent
Kayser et al.

(10) Patent No.: US 10,910,280 B2
(45) Date of Patent: *Feb. 2, 2021

(54) METHODS FOR SEPARATING BONDED WAFER STRUCTURES

(71) Applicant: GlobalWafers Co., Ltd., Hsinchu (TW)

(72) Inventors: Justin Scott Kayser, Wentzville, MO (US); John Francis Valley, Lake Oswego, OR (US); James Dean Eoff, Montgomery City, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/296,456

(22) Filed: Mar. 8, 2019

(65) Prior Publication Data

US 2019/0206745 A1 Jul. 4, 2019

Related U.S. Application Data

(62) Division of application No. 15/866,151, filed on Jan. 9, 2018, now Pat. No. 10,679,908.

(Continued)

(51) Int. Cl.
*H01L 21/66* (2006.01)
*H01L 21/78* (2006.01)
(Continued)

(52) U.S. Cl.
CPC .......... *H01L 22/10* (2013.01); *B28D 5/0005* (2013.01); *B28D 5/0064* (2013.01);
(Continued)

(58) Field of Classification Search
CPC .............. H01L 22/10; H01L 21/67092; H01L 21/67253; H01L 21/76251;
(Continued)

(56) References Cited

U.S. PATENT DOCUMENTS 3,880,028 A * 4/1975 Frederick, Jr. ......... B23Q 15/12
83/880
4,656,868 A * 4/1987 Azuma .............. G05B 19/4065
340/680

(Continued)

FOREIGN PATENT DOCUMENTS

JP 4379943 B2 12/2009
WO 2009141954 A1 11/2009

OTHER PUBLICATIONS

Definition of acoustic emission, www.siveils.com/glossary.htm, printed Oct. 17, 2011 (Year: 2011).*

(Continued)

*Primary Examiner* — Lisa M Caputo
*Assistant Examiner* — Rose M Miller
(74) *Attorney, Agent, or Firm* — Armstrong Teasdale LLP

(57) ABSTRACT

Cleave systems for separating bonded wafer structures, mountable cleave monitoring systems and methods for separating bonded wafer structures are disclosed. In some embodiments, the sound emitted from a bonded wafer structure is sensed during cleaving and a metric related to an attribute of the cleave is generated. The generated metric may be used for quality control and/or to adjust a cleave control parameter to improve the quality of the cleave of subsequently cleaved bonded wafer structures.

19 Claims, 18 Drawing Sheets

Related U.S. Application Data

(60) Provisional application No. 62/449,251, filed on Jan. 23, 2017.

(51) Int. Cl.
| | | |
|---|---|---|
| *H01L 21/67* | (2006.01) | |
| *H01L 21/762* | (2006.01) | |
| *B28D 5/00* | (2006.01) | |
| *B32B 43/00* | (2006.01) | |

(52) U.S. Cl.
CPC ...... *B32B 43/006* (2013.01); *H01L 21/67092* (2013.01); *H01L 21/67253* (2013.01); *H01L 21/76251* (2013.01); *H01L 21/76254* (2013.01); *H01L 21/7806* (2013.01); *B32B 2457/14* (2013.01)

(58) Field of Classification Search
CPC ........... H01L 21/76254; H01L 21/7806; H01L 21/78; B23B 43/003; B23B 43/006; B23B 2547/14; G01N 29/14; B28D 5/0005; B28D 5/0064
USPC .......................................... 73/587, 645, 646
See application file for complete search history.

(56) References Cited

U.S. PATENT DOCUMENTS

| | | | | |
|---|---|---|---|---|
| 4,709,198 | A * | 11/1987 | Ogo | G05B 19/4065 318/39 |
| 4,736,625 | A * | 4/1988 | Patterson | B24B 37/013 340/680 |
| 6,159,825 | A | 12/2000 | Henley et al. | |
| 6,263,941 | B1 | 7/2001 | Bryan et al. | |
| 2008/0188011 | A1 | 8/2008 | Henley | |
| 2009/0277314 | A1 | 11/2009 | Henley | |
| 2011/0016975 | A1 | 1/2011 | Glaesemann et al. | |
| 2016/0225670 | A1 | 8/2016 | Itou et al. | |
| 2016/0346956 | A1 * | 12/2016 | Takekawa | B28D 7/005 |
| 2018/0304429 | A1 * | 10/2018 | Tsuno | B23Q 17/0971 |
| 2018/0326550 | A1 * | 11/2018 | Bhinge | B23Q 3/066 |

OTHER PUBLICATIONS

Definition of acoustic emission, A to Z terms related to the Thermal Spray Process and Surface Engineering, www.gordonengland.co.uk/glossary.htm, printed Oct. 17, 2011 (Year: 2011).*

Definition of acoustic emission, Merriam-Webster online dictionary, printed Jan. 4, 2020 (Year: 2020).*

Cronquist, B., "Low Temperature Cleaving", Monolithic 3D (Aug. 5, 2012), retrieved from http://www.monolithic3d.com/blog/low-temperature-cleaving.

Silicon Genesis Corporation, "Debond & Cleave Tool (DB&C)" (2007).

* cited by examiner

METHODS FOR SEPARATING BONDED WAFER STRUCTURES

CROSS-REFERENCE TO RELATED APPLICATION

This application is a divisional of U.S. patent Ser. No. 15/866,151, filed Jan. 9, 2018, which claims the benefit of U.S. Provisional Patent Application No. 62/449,251, filed Jan. 23, 2017, which are incorporated herein by reference in their entirety.

FIELD OF THE DISCLOSURE

The field of the disclosure relates to cleave systems for separating bonded wafer structures, mountable cleave monitoring systems and methods for separating bonded wafer structures.

BACKGROUND

Silicon on insulator structures ("SOI structures") generally include a handle wafer, a silicon layer (also characterized as a "device layer"), and a dielectric layer (such as an oxide layer) between the handle wafer and the silicon layer. Many silicon semiconductor device designs benefit from using an SOI substrate rather than a bulk silicon polished wafer or epitaxial layer coated substrate. Applications in high volume manufacturing typically benefit from the improved isolation of the device layer, enabling high bandwidth transistors with reduced electro-magnetic cross-talk between adjacent cells within a device.

SOI structures may be prepared from silicon wafers sliced from single crystal silicon ingots grown in accordance with the Czochralski (Cz) method. In one method for preparing an SOI substrate, a dielectric layer is deposited on a polished front surface of a donor wafer. Ions are implanted at a specified depth beneath the front surface of the donor wafer to form a damage layer in the donor wafer at the specified implant depth. The front surface of the donor wafer is then bonded to a handle wafer and the two wafers are pressed to form a bonded wafer pair. The bonded wafer pair is then cleaved along a cleave plane within the damage layer to remove the portion of the donor wafer below the damage layer, leaving behind a thin silicon layer (i.e., the device layer) atop the handle wafer to form the SOI layered substrate.

The mechanical cleave of the bonded wafer pair may result in non-uniform device layer thickness as the cleave progresses from the leading edge at which the cleave commences toward the trailing edge at which the bonded wafers fully separate. Further, in some instances, the cleave may fail and the bonded wafer structure is not cleaved along the desired cleave plane or the bonded wafer structure does not cleave at all. Variations in the cleave are conventionally monitored by operator observation at a downstream process, which may not provide timely feedback to monitor or adjust the appropriate process upstream or at cleaving.

There is a need for cleave systems and methods for separating bonded wafer structures that provide relatively quick feedback relating to the quality of the cleaving process and/or that allow the cleave process to be tuned for subsequent cleaves. There is also a need for cleave monitoring systems that are mountable to existing cleaving apparatus to allow the cleave process to be better monitored.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a cleave system for separating a bonded wafer structure. The cleave system includes a cleaving device for cleaving the bonded wafer structure along a cleave plane. The cleave system includes an acoustic sensor for sensing sound emitted from the bonded wafer structure during cleaving and to generate an output in response to the sensed sound. The cleave system also includes a controller configured to generate a metric related to an attribute of the cleave based at least in part on the output of the acoustic sensor.

Another aspect of the present disclosure is directed to a mountable cleave monitoring system. The system includes a bracket for mounting the system to a cleaving device for separating bonded wafer structures. The system includes an acoustic sensor for sensing sound emitted from a bonded wafer structure during cleaving. The acoustic sensor is mounted to the bracket. The cleave monitoring system also includes a trigger sensor for detecting when a cleave sequence has commenced for cleaving the bonded wafer structure and to trigger recording of sound produced by the bonded wafer structure during the cleave. The trigger sensor is mounted to the bracket.

Yet a further aspect of the present disclosure is directed to a method for separating bonded wafer structures. A bonded wafer structure is cleaved and sound emitted from the bonded wafer structure during cleaving is sensed. A metric related to an attribute of the cleave is generated based on the sensed sound.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
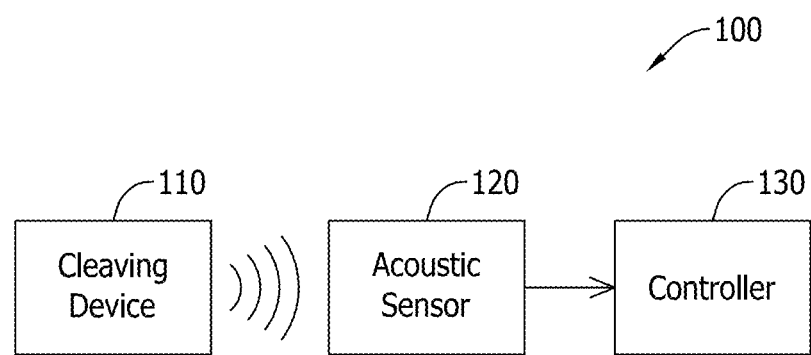
FIG. 1 is a schematic of a cleave system for separating a bonded wafer structure along a cleave plane.

With reference to FIG. 1, a cleave system 100 for separating a bonded wafer structure is shown schematically. The cleave system 100 includes a cleaving device 110 for cleaving the bonded wafer structure and an acoustic sensor 120 for sensing sound emitted from the bonded wafer structure during cleaving.

Bonded wafer structures that may be processed by the cleaving device 110 include any semiconductor structures in which it is desirable to separate the structure into two distinct structures. In some embodiments, the structure that is processed may be a bonded wafer structure that is used to prepare a silicon on insulated structure. Such bonded structures may include a handle wafer, donor wafer and a dielectric layer disposed between the handle wafer and donor wafer. The following is merely one example of methods and systems for processing bonded wafer structures.

Figure 2:
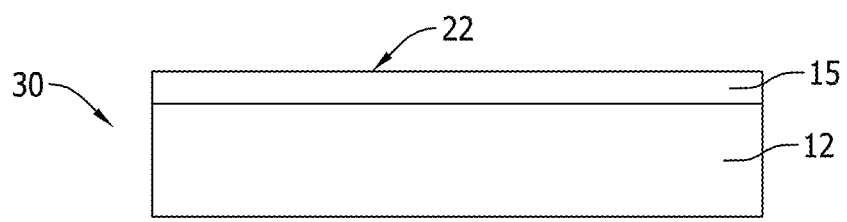
FIG. 2 is a cross-section view of a donor structure having a donor wafer with a dielectric layer thereon.

An example of a donor structure 30 (FIG. 2) that may be bonded to a handle structure to form a bonded wafer structure is shown in FIG. 2. The donor structure 30 may be formed with a dielectric layer 15 deposited on the front surface of a donor wafer 12. It should be understood that, alternatively, the dielectric layer may be grown or deposited on the handle wafer or a dielectric layer may be grown on both the donor wafer and handle wafer and that these structures may be bonded in any of the various arrangements without limitation. Suitable donor wafers 12 may be composed of silicon, germanium, silicon germanium, gallium nitride, aluminum nitride, gallium arsenide, indium gallium arsenide and any combination thereof. In some embodiments, the donor wafer is composed of single crystal silicon.

The dielectric layer 15 may be any electrically insulating material suitable for use in a SOI structure, such as a material comprising $SiO_2$, $Si_3N_4$, aluminum oxide, or magnesium oxide. In some embodiments, the dielectric layer 15 is $SiO_2$ (i.e., the dielectric layer consists essentially of $SiO_2$). The dielectric layer 15 may be applied according to any known technique in the art, such as thermal oxidation, wet oxidation, thermal nitridation or a combination of these techniques. In this regard it should be understood that, while the layered semiconductor structures may be described herein as having a dielectric layer, in some embodiments the dielectric layer is eliminated (i.e., a dielectric layer is not deposited on the donor wafer or handle wafer prior to bonding) and the handle wafer and donor wafer are "direct bonded." Reference herein to such dielectric layers should not be considered in a limiting sense. Any one of a number of techniques known to those of skill in the art may be used to produce such direct bonded structures. In such embodiments, the bonding surface of the donor structure is the surface of the donor wafer itself.

Figure 3:
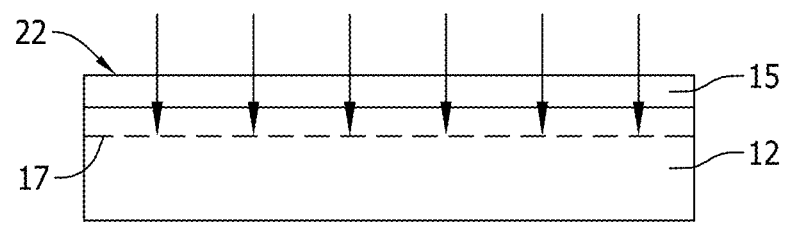
FIG. 3 is cross-section view of the donor structure during ion implantation thereon.

As shown for example in FIG. 3, ions (e.g., hydrogen atoms, helium atoms or a combination of hydrogen and helium atoms) may be implanted at a substantially uniform specified depth beneath the front surface 22 of the donor structure to define a cleave plane 17. It should be noted, that when helium and hydrogen ions are co-implanted into the structure to form the cleave plane, they may be implanted concurrently or sequentially. In some embodiments, ions are implanted prior to deposition of the dielectric layer 15. When implantation is performed prior to deposition of the dielectric layer 15, the subsequent growth or deposition of the dielectric layer on the donor wafer is suitably performed at a temperature low enough to prevent premature separation or cleaving along plane 17 in the donor layer (i.e., prior to the wafer bonding process step). The handle structure may include a handle wafer obtained from any suitable material for preparing multi-layered structures, such as silicon, silicon carbide, sapphire, germanium, silicon germanium, gallium nitride, aluminum nitride, gallium arsenide, indium gallium arsenide, quartz and combinations thereof. The handle structure 10 (FIG. 4) may include a dielectric layer deposited on a handle wafer or, as in other embodiments, consists only of a handle wafer (i.e., does not include a dielectric layer). The handle wafer and donor wafer may be single crystal silicon wafers and may be single crystal silicon wafers which have been sliced from a single crystal ingot grown in accordance with conventional Czochralski crystal growing methods.

Figure 4:
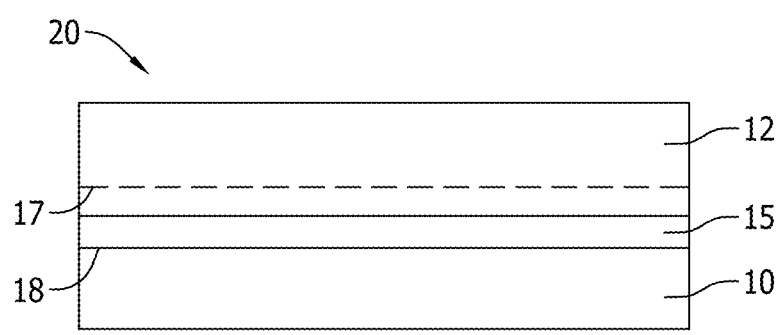
FIG. 4 is a cross-section view of the donor structure bonded to a handle structure.

As shown in FIG. 4, the front surface of the dielectric layer 15 of the donor structure is suitably bonded to the front surface of the handle structure 10 to form a bonded wafer structure 20 through a bonding process. The dielectric layer 15 and handle structure 10 may be bonded together while performing a surface activation by exposing the surfaces of the structures to a plasma containing, for example, oxygen or nitrogen. The wafers are then pressed together and a bond at the bond interface 18 is formed there between. Generally speaking, wafer bonding may be achieved using essentially any technique known in the art, provided the energy employed to achieve formation of the bond interface is sufficient to ensure that the integrity of the bond interface is sustained during subsequent processing (i.e., layer transfer by separation along the cleave or separation plane 17 in the donor wafer). Once prepared, the bonded wafer structure 20 is placed in the cleaving device 110 (FIG. 1) to separate (i.e., cleave) a portion of the donor wafer along the cleave plane from the bonded structure to form the layered semiconductor structure. Generally speaking, the cleaving device 110 may induce this fracture using techniques known in the art, such as thermally and/or mechanically induced cleaving techniques.

Figure 5:
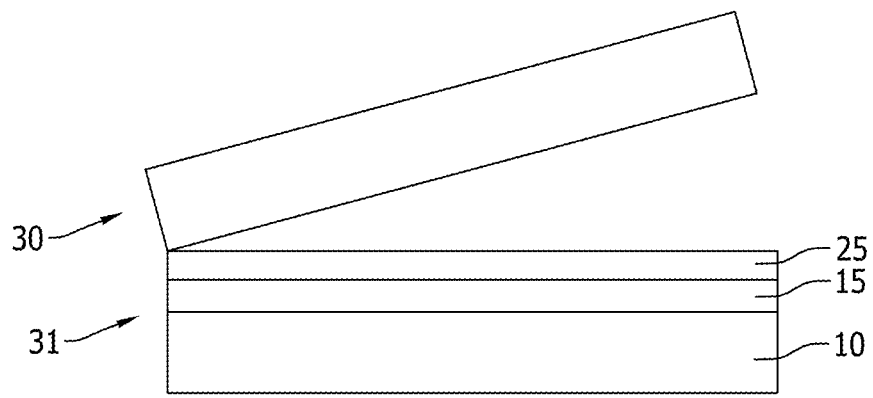
FIG. 5 is a cross-section view of a bonded wafer structure upon cleaving the donor structure at the cleave plane.

Referring to FIG. 5, upon separation, two structures 30, 31 are formed. Because the separation of the bonded wafer structure 20 occurs along the cleave plane 17 in the donor structure 12 (FIG. 4), a portion of the donor structure remains part of both structures (i.e., a portion of the donor wafer is transferred along with the dielectric layer). Structure 30 comprises a portion of the donor wafer. Structure 31 is the SOI structure and includes a handle layer 10, dielectric layer 15 and device layer 25 (the portion of the donor wafer remaining after cleaving) disposed atop the dielectric layer 15. In embodiments in which the donor structure and handle structure both include a dielectric layer, the dielectric layers combine to form the dielectric layer 15 of the SOI structure. The cleave surface of the layered semiconductor structure (i.e., the thin device layer of the donor wafer) has a rough surface that may be smoothed by additional processing. The structure 31 may be subjected to additional processing to produce a device layer surface having desirable features for device fabrication thereon. The cleaving device 110 used to separate the bonded wafer structure along the cleave plane may be a mechanical cleaving device in which separation is induced or achieved by means of mechanical force, either alone or in addition to annealing. For instance, the bonded structure may be placed in a fixture in which mechanical force is applied perpendicular to the opposing sides of the bonded structure in order to pull a portion of the donor structure apart from the bonded structure.

Figure 6:
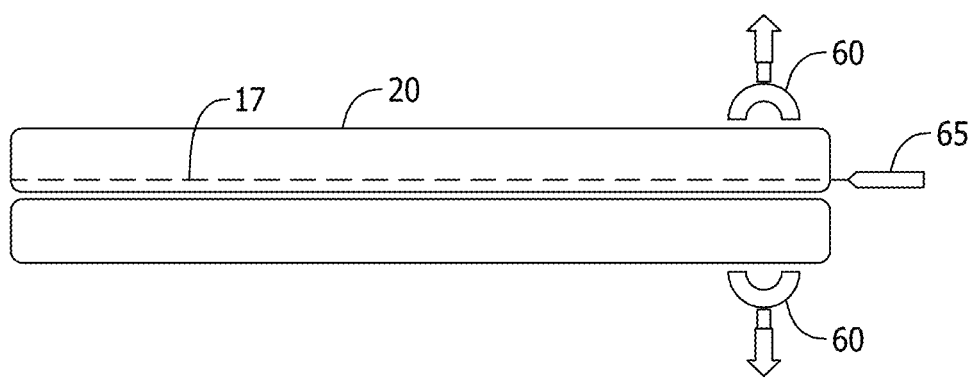
FIG. 6 is a cross-section view of a bonded wafer structure having suction cups and a blade to propagate the cleave.

As shown in FIG. 6, an example cleaving device includes suction cups 60 that apply mechanical force near a leading cleave edge of the bonded wafer structure 20. The separation of the portion of the donor wafer may be initiated by applying a mechanical wedge or blade 65 at the edge of the bonded wafer at the cleave plane 17 in order to initiate propagation of a crack along the cleave plane 17. The mechanical force applied by the suction cups 60 then pulls the portion of the donor structure from the bonded structure, thus forming the SOI structure. Mechanical cleaving devices are commercially available such as the Debond & Cleave Tools from Silicon Genesis Corporation (San Jose, Calif.).

In alternative embodiments, the cleaving device 110 is a thermal cleaving device in which fracturing is achieved by annealing the bonded structure. For example, a thermal cleave may performed at a temperature about 200° C. to about 800° C., or from about 250° C. to about 650° C. for a period of at least about 10 seconds, at least about 1 minute, at least about 15 minutes, at least about 1 hour or even at least about 3 hours (with higher temperatures requiring shorter anneal times, and vice versa), under an inert (e.g., argon or nitrogen) atmosphere or ambient conditions. The thermal cleaving device 110 may be a belt furnace in which propagation of the cleave is achieved at the leading edge of the bonded structure (i.e., the leading edge in the direction of travel of the structure through the furnace) and proceeds toward the trailing edge of the bonded wafer structure. Other types of cleaving devices may also be used.

The cleaving device 110 may generally be configured to process any size of bonded wafer structures including, for example, 200 mm, 300 mm, greater than 300 mm or even 450 mm diameter bonded wafer structures. In some embodiments, the cleaving device is configured to process bonded wafer structures that are 200 mm or 300 mm in diameter.

The cleaving system 100 includes an acoustic sensor 120 for sensing sound emitting from the bonded wafer structure during cleaving and for generating an output in response to the sensed sound. The acoustic sensor 120 may be a microphone, piezo sensor, MEMS device or a sound pressure or field transducer.

A controller 130 is configured to generate one or more metrics related to an attribute(s) of the cleave (e.g., duration of cleave, quality of cleave, whether a no-layer-transfer condition occurred or a pause in the cleave as it progresses across the wafer) based on the recorded output from the acoustic sensor 120. In some embodiments, the metric generated by the controller 130 is derived from an audio power profile generated during the cleave. The audio power profile may be derived from the audio amplitude as described in Example 1 below. Examples of metrics that may be calculated include the delay between when the cleave is triggered and the sensed start of the cleave, the duration of the cleave, the mean power during the cleave, the maximum power, the frequency at which maximum power occurs, standard deviation of power, magnitude of power oscillations, amount of cleave time below a threshold power, maximum single dip time below a threshold power and the number of power dips below a threshold power. In some embodiments, 2 or more metrics are generated or even 3 or more, 5 or more, 7 or more or 10 or more metrics are generated by the controller 130.

The controller 130 may be a computer system. Computer systems, as described herein, refer to any known computing device and computer system. As described herein, all such computer systems include a processor and a memory. However, any processor in a computer system referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

The term processor, as used herein, refers to central processing units, microprocessors, microcontrollers, reduced instruction set circuits (RISC), application specific integrated circuits (ASIC), logic circuits, and any other circuit or processor capable of executing the functions described herein. The above are examples only, and are thus not intended to limit in any way the definition and/or meaning of the term "processor."

The term "database" may refer to either a body of data, a relational database management system (RDBMS), or to both and a database may include any collection of data including hierarchical databases, relational databases, flat file databases, object-relational databases, object oriented databases, and any other structured collection of records or data that is stored in a computer system. The above are examples only, and thus are not intended to limit in any way the definition and/or meaning of the term database. Examples of RDBMS's include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, Calif.; IBM is a registered trademark of International Business Machines Corporation, Armonk, N.Y.; Microsoft is a registered trademark of Microsoft Corporation, Redmond, Wash.; and Sybase is a registered trademark of Sybase, Dublin, Calif.)

In one embodiment, a computer program is provided to enable the controller 130, and this program is embodied on a computer readable medium. In an example embodiment, the computer system is executed on a single computer system, without requiring a connection to a server computer. In a further embodiment, the computer system is run in a Windows® environment (Windows is a registered trademark of Microsoft Corporation, Redmond, Wash.). In yet another embodiment, the computer system is run on a mainframe environment and a UNIX® server environment (UNIX is a registered trademark of X/Open Company Limited located in Reading, Berkshire, United Kingdom). Alternatively, the computer system is run in any suitable operating system environment. The computer program is flexible and designed to run in various different environments without compromising any major functionality. In some embodiments, the computer system includes multiple components distributed among a plurality of computing devices. One or more components may be in the form of computer-executable instructions embodied in a computer-readable medium.

The computer systems and processes are not limited to the specific embodiments described herein. In addition, components of each computer system and each process can be practiced independent and separate from other components and processes described herein. Each component and process also can be used in combination with other assembly packages and processes.

In another embodiment, the memory included in the computer system of the controller 130 may include a plurality of modules. Each module may include instructions configured to execute using at least one processor. The instructions contained in the plurality of modules may implement at least part of the method for generating metrics related to an attribute of the cleave based at least in part on the sensed sound herein when executed by the one or more processors of the computing device. Non-limiting examples of modules stored in the memory of the computing device include: a first module to receive measurements from one or more sensors and a second module to produce metrics associated with the cleave.

The computer system of one embodiment includes one media output component for presenting information to a user. Media output component is any component capable of conveying information (e.g., such as metrics associated with the cleave) to a user. In some embodiments, media output component includes an output adapter such as a video adapter and/or an audio adapter. An output adapter is operatively coupled to a processor and is further configured to be operatively coupled to an output device such as a display device (e.g., a liquid crystal display (LCD), organic light emitting diode (OLED) display, cathode ray tube (CRT), or "electronic ink" display) or an audio output device (e.g., a speaker or headphones).

Figure 7:
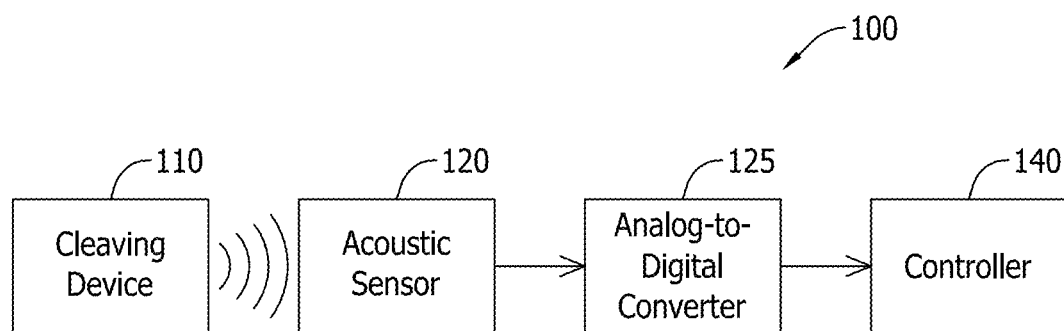
FIG. 7 is a schematic of another cleave system for separating a bonded wafer structure along a cleave plane having an analog-to-digital converter.

Referring to FIG. 7, the system may include an analog-to-digital converter 125 to convert the sound sensed by the acoustic sensor 120 to data (i.e., converts the analog signal to a digital signal). The controller 130 may generate a metric related to an attribute of the cleave based at least in part of the data generated by the analog-to-digital converter 125. The analog-to-digital converter 125 may be a digitizer or, as in other embodiments, a sound card. The analog-to-digital converter 125 may be part of the controller 130 or part of the acoustic sensor 120. In some embodiments, the analog-to-digital converter 125 records a sample at a rate of at least about 30,000 Hz or at least about 60,000 Hz, at least about 120,000 Hz or at least about 240,000 Hz.

Figure 8:
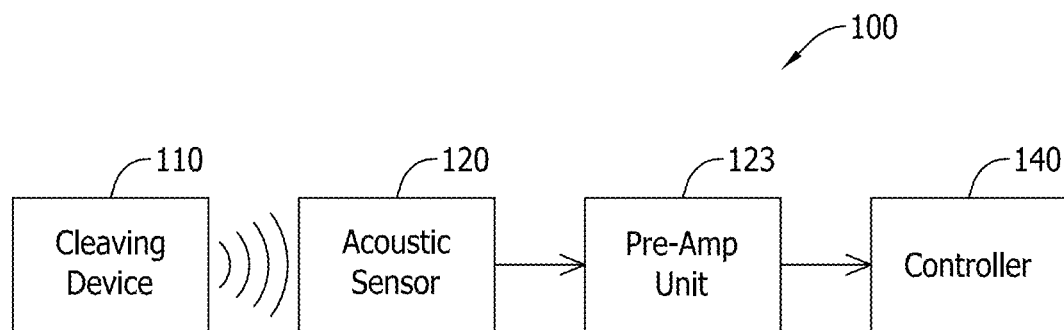
FIG. 8 is a schematic of another cleave system for separating a bonded wafer structure along a cleave plane having a preamplifier unit.

In some embodiments and as shown in FIG. 8, the system includes a preamplifier unit 123 (which may optionally be used with the analog-to-digital converter 125 shown in FIG. 7). The preamplifier unit 123 strengthens the output from the acoustic sensor 120. The preamplifier unit 123 may be combined with the acoustic sensor 120 (i.e., sensor 120 and pre-amplifier 123 are components of a single device).

Figure 9:
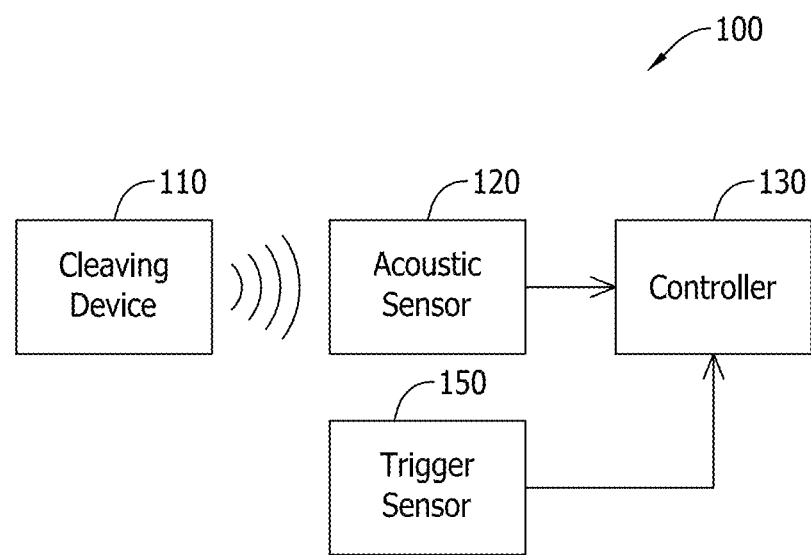
FIG. 9 is a schematic of another cleave system for separating a bonded wafer structure along a cleave plane having a trigger sensor.

As shown in FIG. 9, the system 100 may also include a trigger sensor 150 for detecting when a cleave sequence has commenced for cleaving the bonded wafer structure. In mechanical cleaves, the commencement of the cleave sequence may by indicated by movement of the cleave arm that occurs when the cleave arm grasps the donor wafer during cleaving. The trigger sensor 150 may be any suitable device which senses the start of a cleave such as a camera, photoelectric sensor or limit switch that senses movement of the cleave arm or any movement of the cleave device that indicates that the cleave has commenced. The trigger sensor 150 may also be a sensor that senses or receives the control signal that initiates the cleaving (i.e., is part of the cleave software). In some embodiments, sound is sensed and monitored and recording is triggered when a change in sound in sensed (e.g., audio power exceeds a predetermined threshold).

In embodiments in which a trigger sensor 150 is used, the trigger sensor 150 triggers the controller 130 to indicate the start of cleaving to allow the controller 130 to begin saving and/or analyzing the output from the acoustic sensor 120. In embodiments in which the system 100 includes an analog-to-digital converter 125 (FIG. 7), the trigger sensor 150 may be used to trigger the converter 125.

Figure 10:
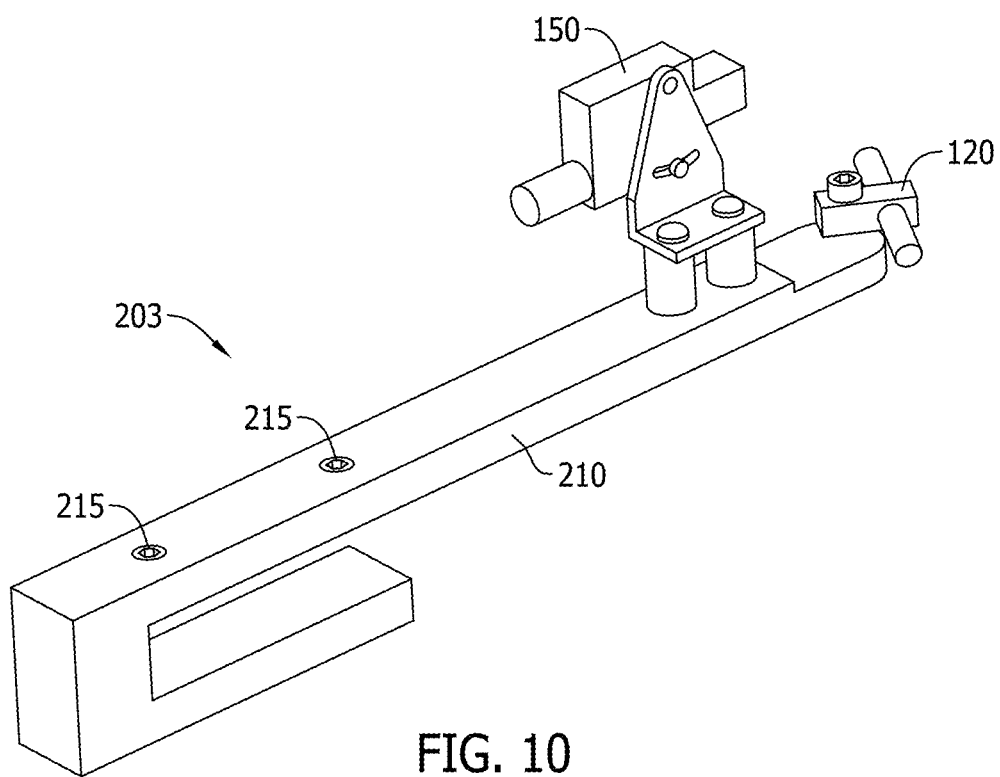
FIG. 10 is a perspective view of a mountable cleave monitoring system.
Figure 11:
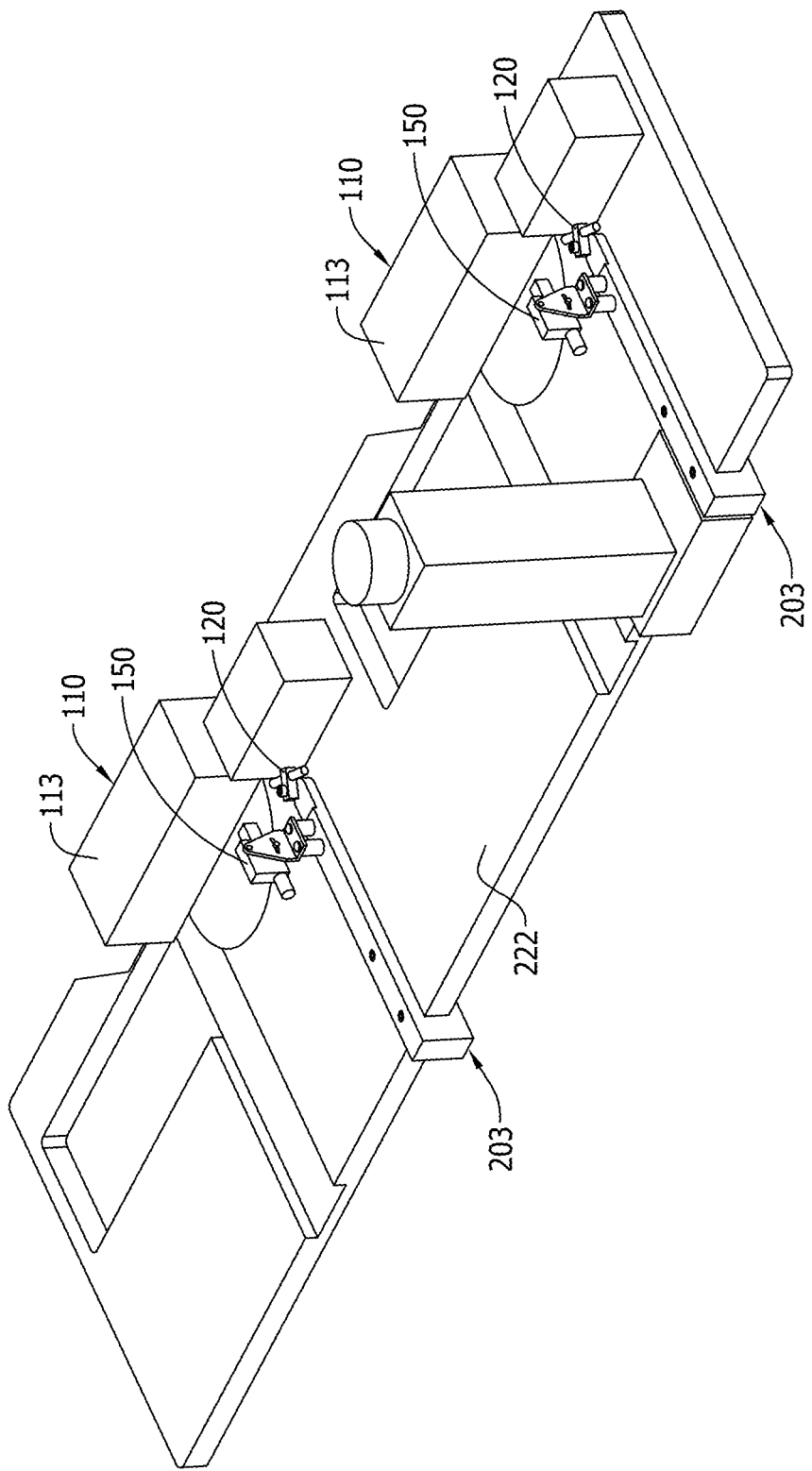
FIG. 11 is a perspective view of two mountable cleave monitoring systems mounted to the cleaving devices of a two-station cleaving apparatus.
Figure 12:
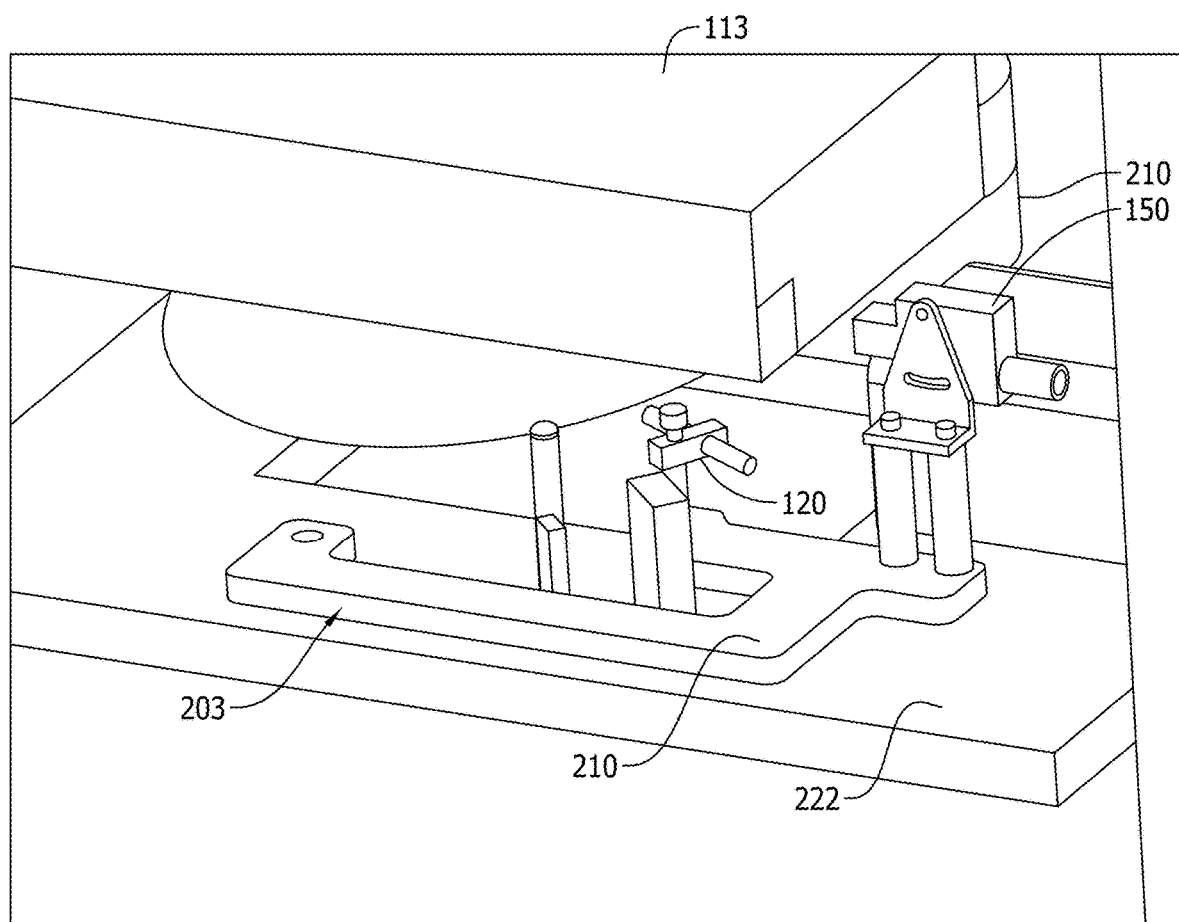
FIG. 12 is a perspective view of another embodiment of a mountable cleave monitoring system mounted to a single-station cleaving apparatus.

Referring to FIG. 10, the acoustic sensor 120 and trigger sensor 150 may be part of a mountable cleave monitoring system 203 that may be mounted to existing cleaving apparatus such as mechanical cleaving devices. The mountable cleave monitoring system 203 includes a bracket 210 for mounting the system 203 to the cleaving device 110 (FIGS. 11 and 12). In this embodiment, the bracket 210 includes set screws 215 for securing the bracket 210 to the cleaving device 110. Other embodiments of the monitoring system 203 may include other types of fasteners for securing the system 203 to the cleaving device.

The acoustic sensor 120 and trigger sensor 150 are each mounted to the bracket 210. As show in FIGS. 10-12, the acoustic sensor 120 is a microphone and the trigger sensor 150 is a photoelectric sensor. Other types of acoustic sensors 120 and trigger sensors 150 may be used in other embodiments of the mountable cleave monitoring system 203. In some embodiments, the cleave monitoring system 203 includes software to direct a controller to generate metrics such as metrics associated with the audio power profile of the cleave.

Referring now to FIG. 11, a two station cleaving apparatus is shown. Two cleave monitoring systems 203 are mounted to two cleaving devices 110 of the apparatus. The monitoring system 203 is fastened to the base plate 222 of the cleaving apparatus. The acoustic sensor 120 is positioned near the trailing edge of the bonded wafer structure (i.e., rear edge opposite from the side at which the cleave is propagated). The trigger sensor 150 is directed toward the cleave arm 113 of the cleaving device 110.

A single station cleaving apparatus with a mountable cleave monitoring system 203 attached thereto is shown in FIG. 12. The cleave monitoring system 203 includes a bracket 210 attached to the base plate 222 of the cleaving device 110. The bracket 210 has an acoustic sensor 120 and a trigger sensor 150 attached thereto. The trigger sensor 150 senses movement of the cleave arm 113.

Aspects of the present disclosure are directed to methods and systems for separating bonded wafer structures such as, for example, by use of the cleave system 100 described above. A bonded wafer structure is cleaved (e.g., by propagation mechanically or thermally) and sound emitted from the bonded wafer structure during cleaving is sensed. The sound may be amplified and/or converted to a digital signal. In some embodiments, the audio field amplitude is used to generate a power profile (e.g., as in Example 1 below). The audio amplitude data of the cleave may be normalized and stepped through taking power spectra. The audio amplitude audio data used in one power spectrum may be used in the adjacent power spectrum to produce a smoothly varying power function as a function of time.

In some embodiments, a fast Fourier transform (FFT) algorithm may be used to generate the power function from the amplitude audio data. In some embodiments, a stepped FFT method is used to produce a smooth varying power function (e.g., a stepped FFT without filtering). Such stepped FFT methods may allow the profile to be smoother with less blurring of dip transition edges without resort to a filter.

In other embodiments, a non-FFT method is used. For example, the raw audio power profile data may be filtered digitally to produce the power profile.

A metric related to the attribute of the cleave is generated based at least in part on the sensed sound. The metric may be derived from the audio power profile of the cleave and includes the metrics listed above (max power, dip time, number of dips, etc.). Once the metric is generated, the metric, or a combination of metrics, may be used to determine the quality of the resulting SOI structure. For example, the metric may indicate that the device layer did not transfer properly and the wafer should be removed from the lot. In some embodiments, the metric indicates that a cleave control parameter may be adjusted to improve the quality of the cleave of subsequently cleaved bonded wafer structures (i.e., tuning of the cleave process). For example, the initial pull strain may be adjusted, or the pull increment, pull count, strain window, split speed, split acceleration, split deceleration, maximum split time, blade speed or blade travel.

In some embodiments, the commencement of the cleave sequence is detected with sound being sensed upon detecting that the cleave sequence has commenced. This may be detecting by monitoring movement of the cleave arm.

In some embodiments, the system 101 is configured to execute a control action based on one or more metrics generated by the controller 130. The metric(s) may cause the system to discard a cleaved wafer or to sort the wafers based on the quality of the cleave as indicated by the metric(s). In other embodiments, the metrics cause the system to adjust a cleaving parameter (e.g., the initial pull strain, pull increment, pull count, strain window, split speed, split acceleration, split deceleration, maximum split time, blade speed or blade travel).

Compared to conventional cleave systems for separating bonded wafer structures, the systems of the present disclosure have several advantages. By sensing the sound during a cleave and generating data from the sound, the data may be processed to generate metrics for quality control and/or to tune the cleaving apparatus and process to improve subsequent cleaves. In embodiments in which a digitizer is used, a relatively high rate of audio sampling may be used which improves the generated metrics. In embodiments in which a mountable cleave monitoring system is provided, the system may be mounted to existing cleave systems to alter the system to allow the cleave of bonded wafer structures to be monitored for quality control and/or cleave tuning.

EXAMPLES

The processes of the present disclosure are further illustrated by the following Examples. These Examples should not be viewed in a limiting sense.

Example 1: Processing of Cleave Audio

Figure 13:
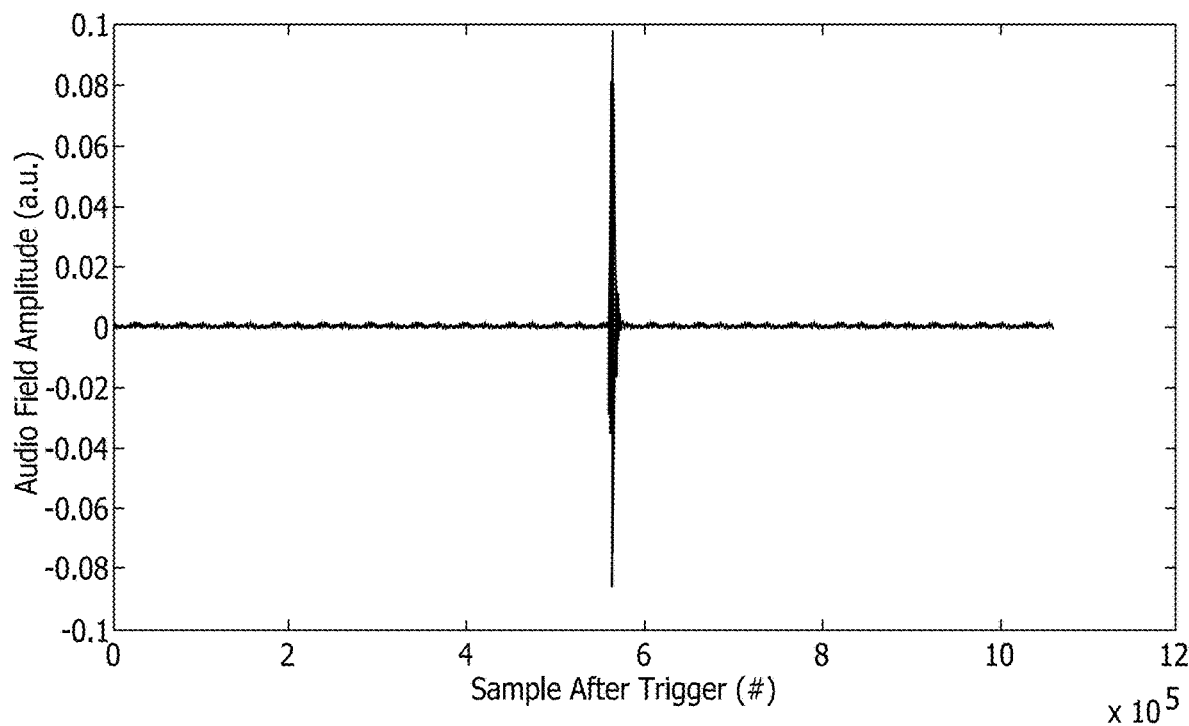
FIG. 13 is the raw audio signal during a cleave of a bonded wafer structure.

The audio from the cleave of a 100 mm bonded wafer structure was recorded with a microphone and digitizer (max sampling frequency 216,000 Hz). The audio signal was recorded for 5 seconds. The raw audio signal is shown in FIG. 13.

Figure 14:
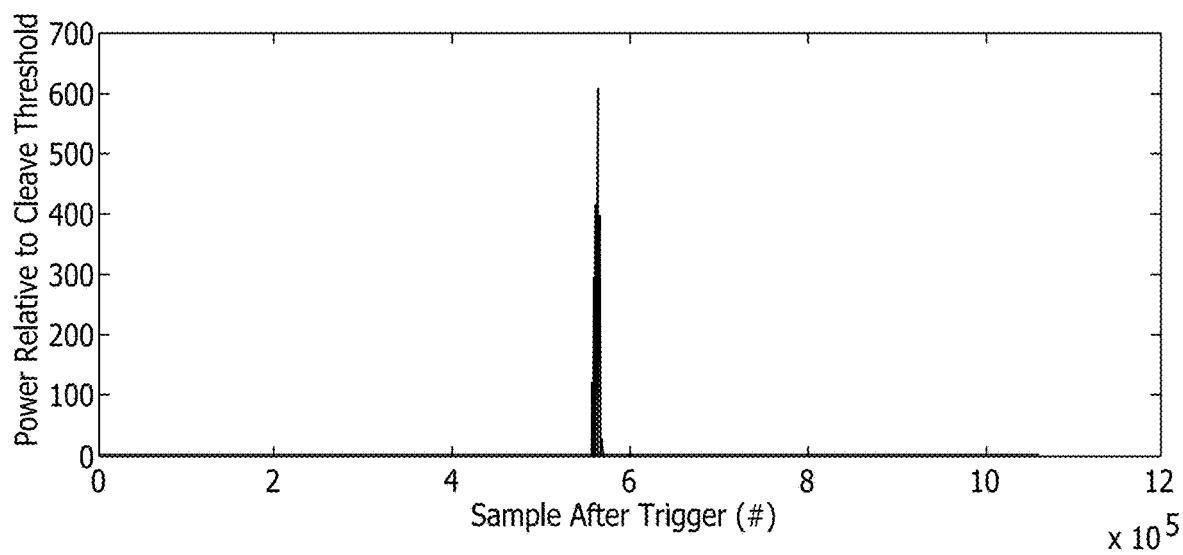
FIG. 14 is the power profile of the raw audio signal.
Figure 15:
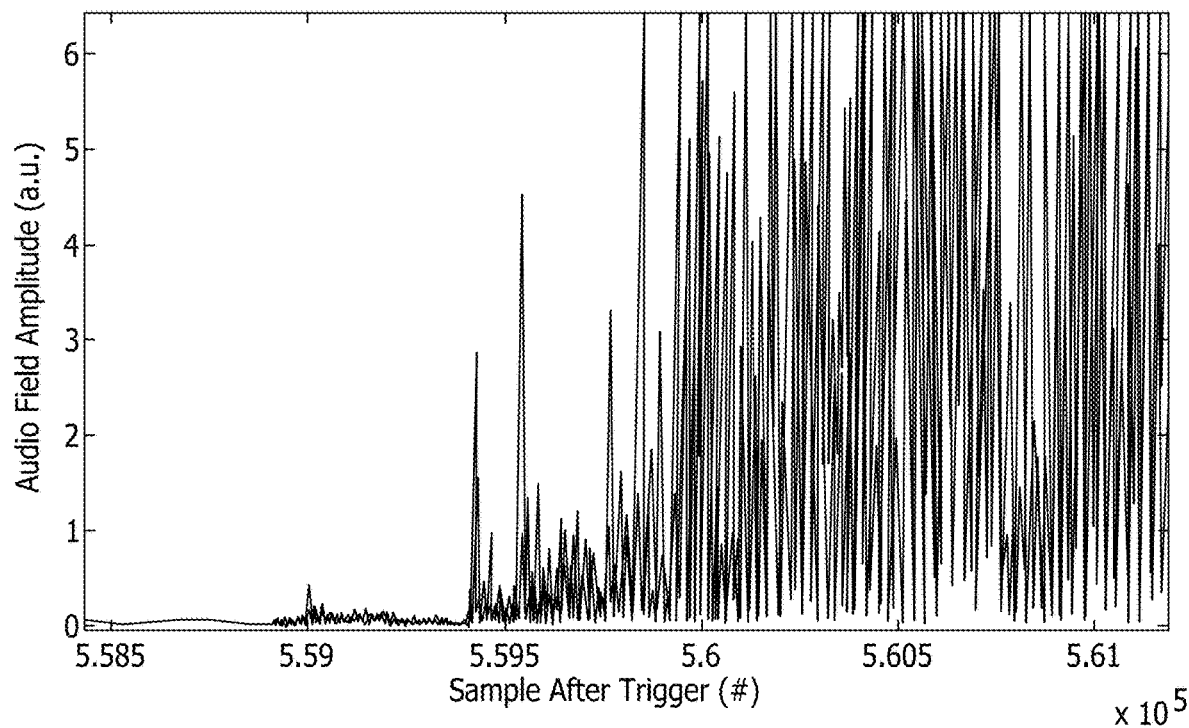
FIG. 15 is the power profile near the start of the cleave.
Figure 16:
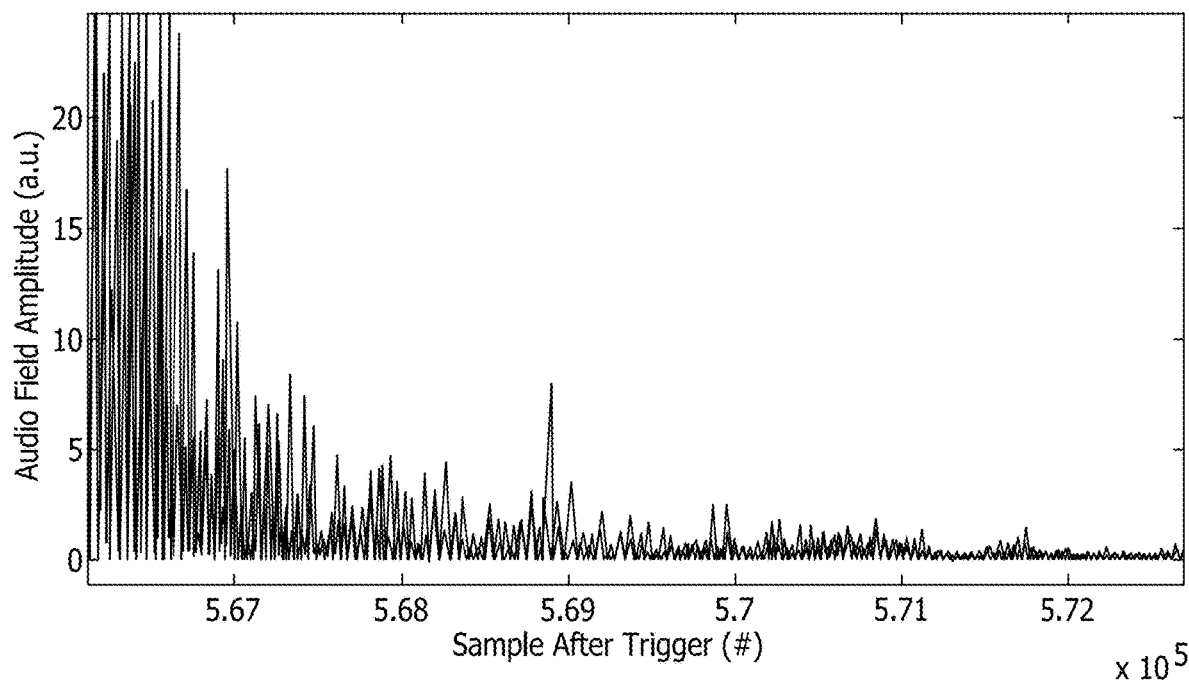
FIG. 16 is the power profile near the end of the cleave.

The power signal is the square of the ratio of the raw audio field amplitude and the cleave threshold audio amplitude. The raw power profile across the recorded audio samples is shown in FIG. 14. The cleave threshold is an input parameter based on experimental data (e.g., 0.004 absolute field amplitude shown in FIG. 13). FIG. 15 shows the calculated power near the cleave start. The first power over threshold (power equal to 1 being the threshold power level) represents the start of cleave. FIG. 16 shows the calculated power near the end of the cleave with the end of the cleave being represented the last point at which power is greater than a threshold below which there is "quiet" during the cleave process ("PDIP").

Figure 17:
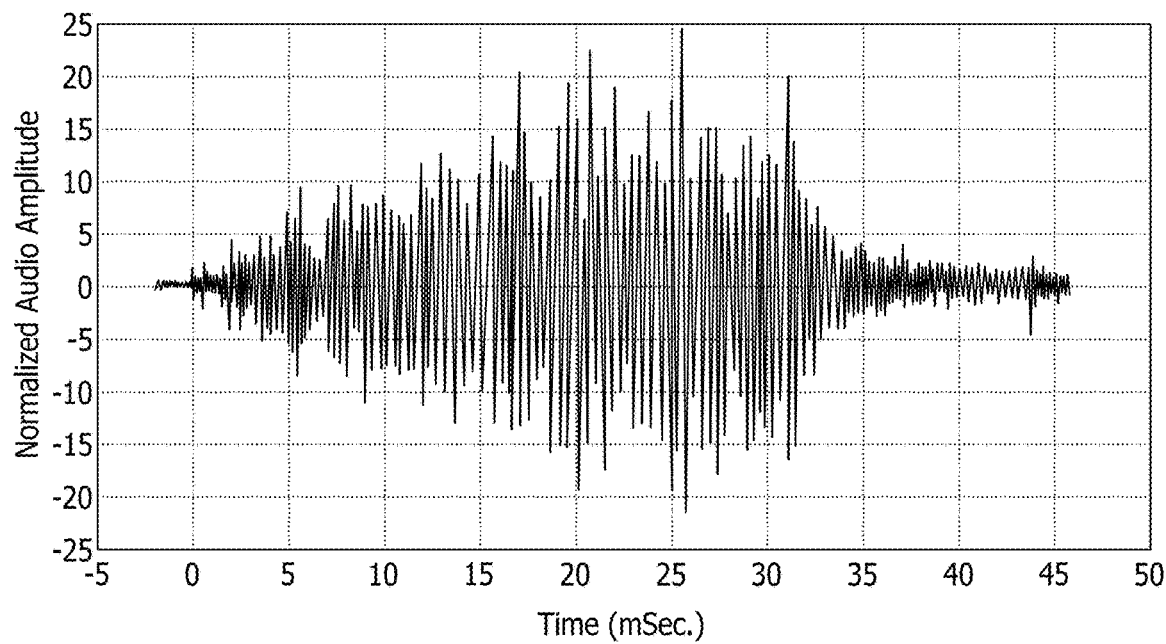
FIG. 17 is the raw cleave audio normalized to a threshold value.

The raw cleave audio, normalized to the threshold value and starting at 2 milliseconds before the beginning of cleave and 2 milliseconds after the cleave is shown in FIG. 17.

Figure 18:
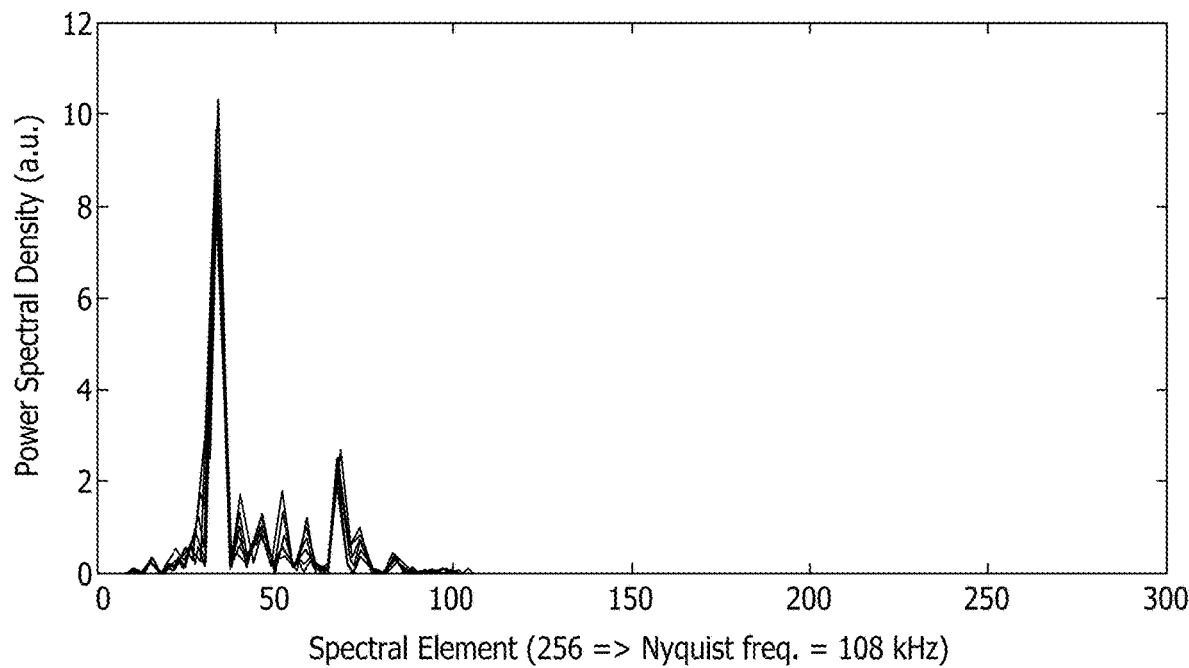
FIG. 18 is the audio power spectra of the audio data.
Figure 19:
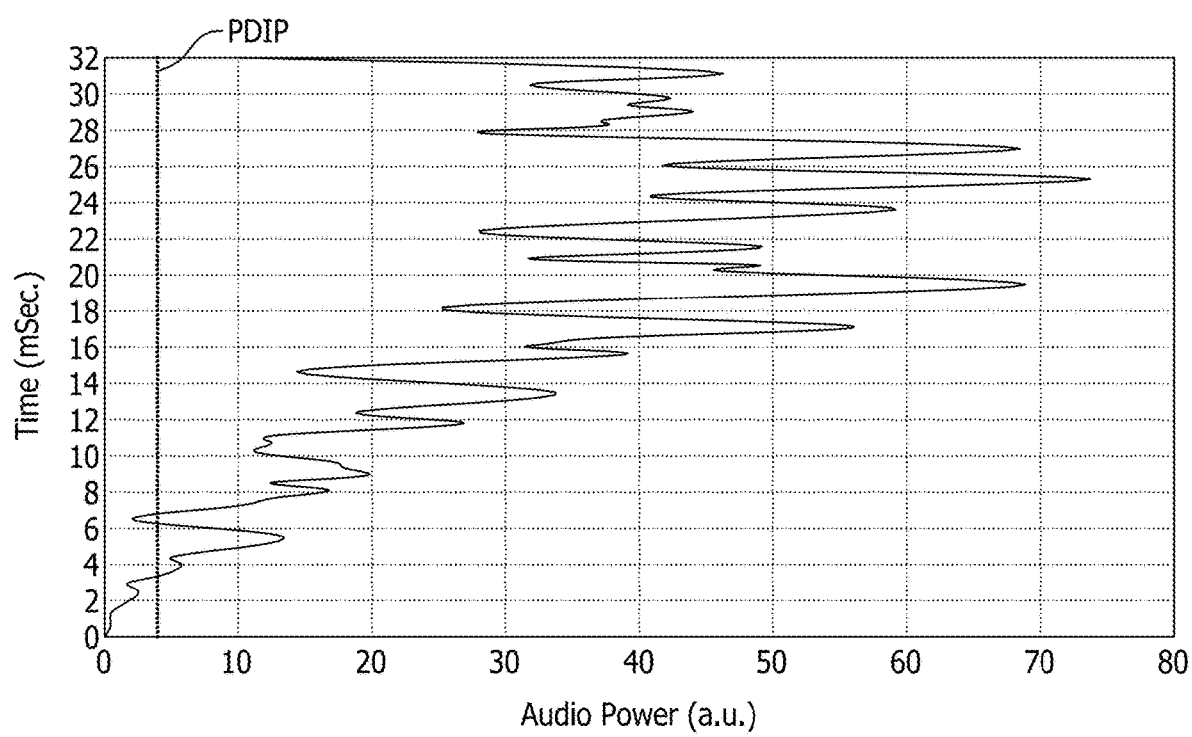
FIG. 19 is the audio power profile as a function of time for the cleave.
Figure 20:
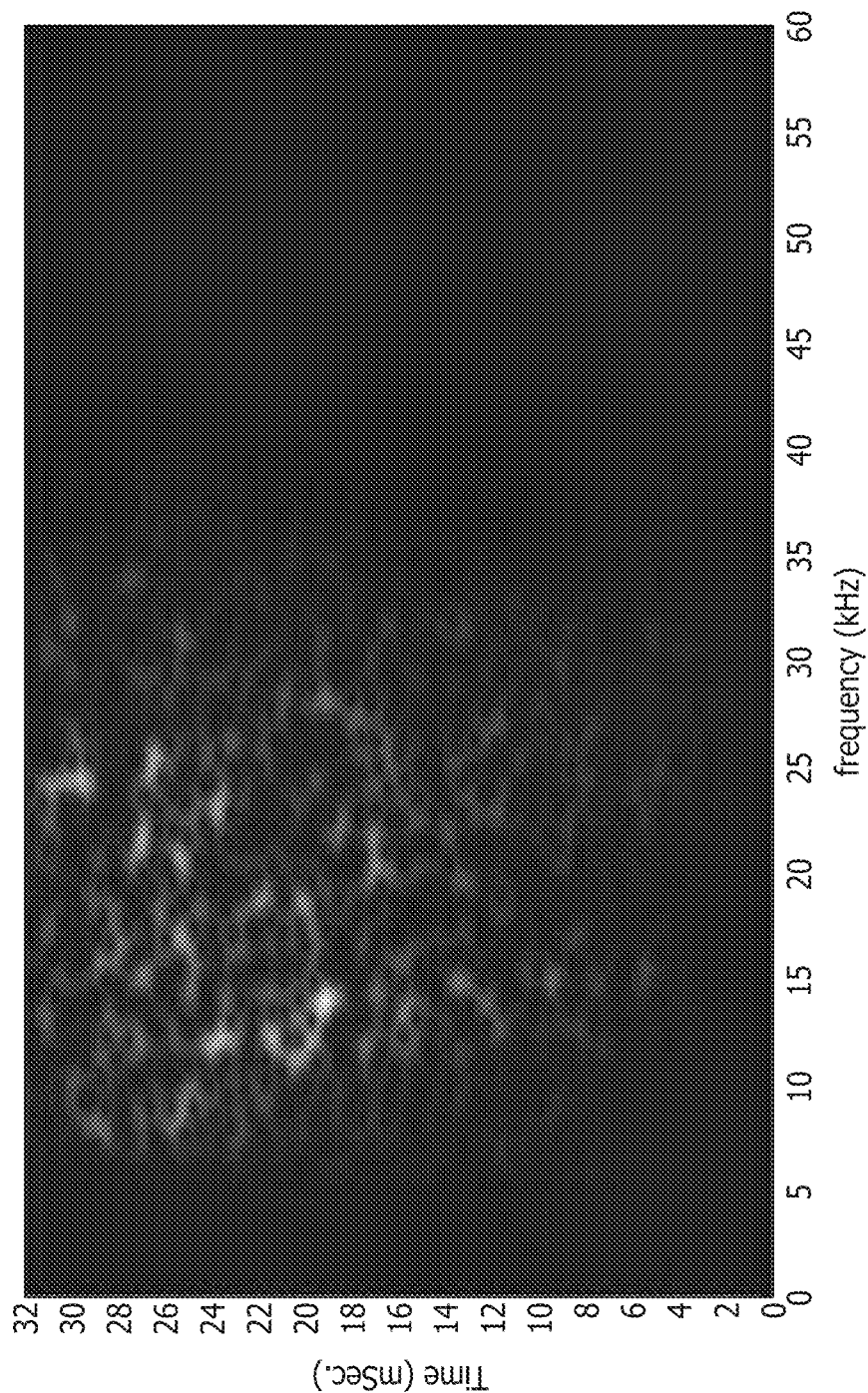
FIG. 20 is a gray-scale map of power spectra.

The normalized audio amplitude data was stepped through taking power spectra (FIG. 18). Some normalized audio amplitude audio data used in one power spectrum was also used in the adjacent power spectrum. The stepped-FFT approach produced a smoothly varying power function as a function of time as shown in FIG. 19, where audio power is the sum of all power spectra components excluding the zero frequency or DC component. FIG. 20 shows the power spectra as a gray-scale map. Metrics were generated from the power profile. Calculated metrics included the delay between a cleave trigger and a start of cleave (Delay), duration of the cleave (Duration), mean power (P-mean), maximum power (P-max), frequency of maximum power (Freq P-Max), standard deviation of power (P-Sigma), magnitude of power oscillations (Power Osc.), amount of cleave time below dip threshold (Dip Time %), maximum single dip time (LongDip) and the number of power dips (Dips #). The metrics for the cleave of FIG. 19 are shown in Table 1 below.

TABLE 1

Audio Power Profile Metrics for the Power Profile of FIG. 19

| Delay (mS) | Duration (mS) | P-Mean | P-Max | Freq-P-Max (kHz) |
|---|---|---|---|---|
| 2589.94 | 32.25 | 21.2 | 74.35 | 11.81 |

| P-Sigma | Power Osc. | DipTime % | LongDip (mS) | Dips # |
|---|---|---|---|---|
| 20 | 651.69 | 1.83 | 0.8 | 1 |

Figure 21:
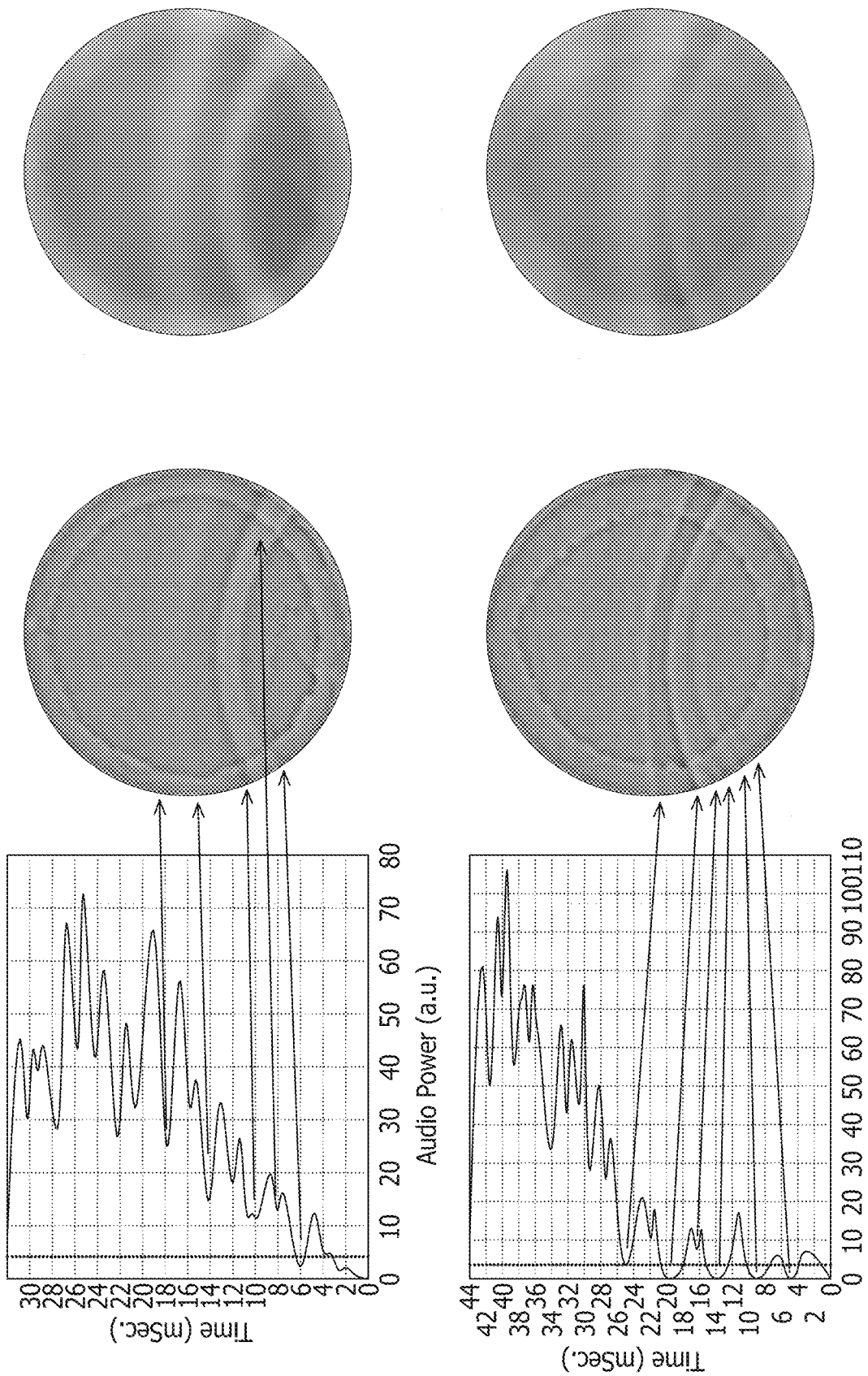
FIG. 21 shows the power profile of FIG. 19 correlated to the filtered top silicon film thickness data map of the structure after cleaving and shows the power profile of another cleave with dips being correlated to thickness arcs of the filtered top silicon film thickness data map of the cleaved structure.

The top row of FIG. 21 shows the power profile of FIG. 19 with power dips correlated to the filtered top silicon film thickness data map. The raw top-silicon film thickness data map is also shown in FIG. 21 to the far right. FIG. 21 (bottom row) also shows the power profile of another cleaved bonded wafer structure and the relevant film thickness data map with dips being correlated to potential thickness arcs.

Figure 22:
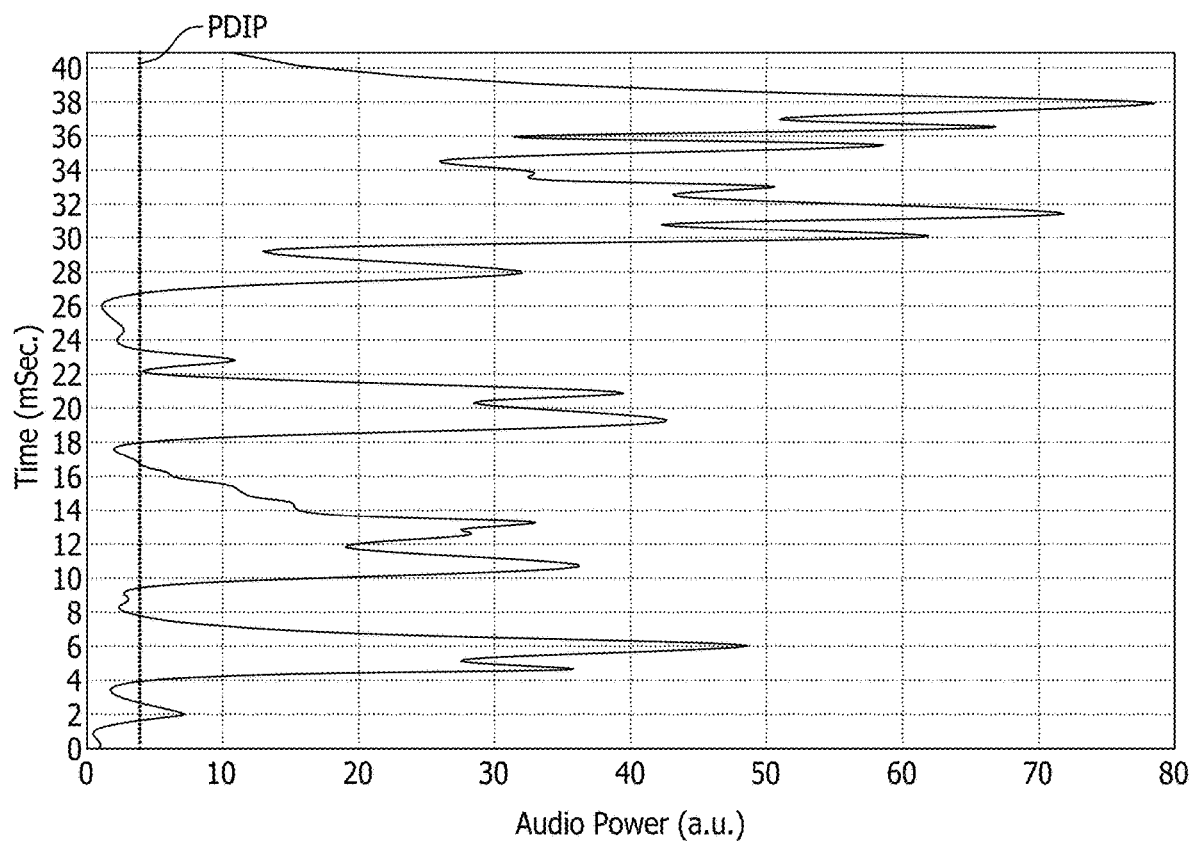
FIG. 22 is the power profile of another cleave of a bonded wafer structure.
Figure 23:
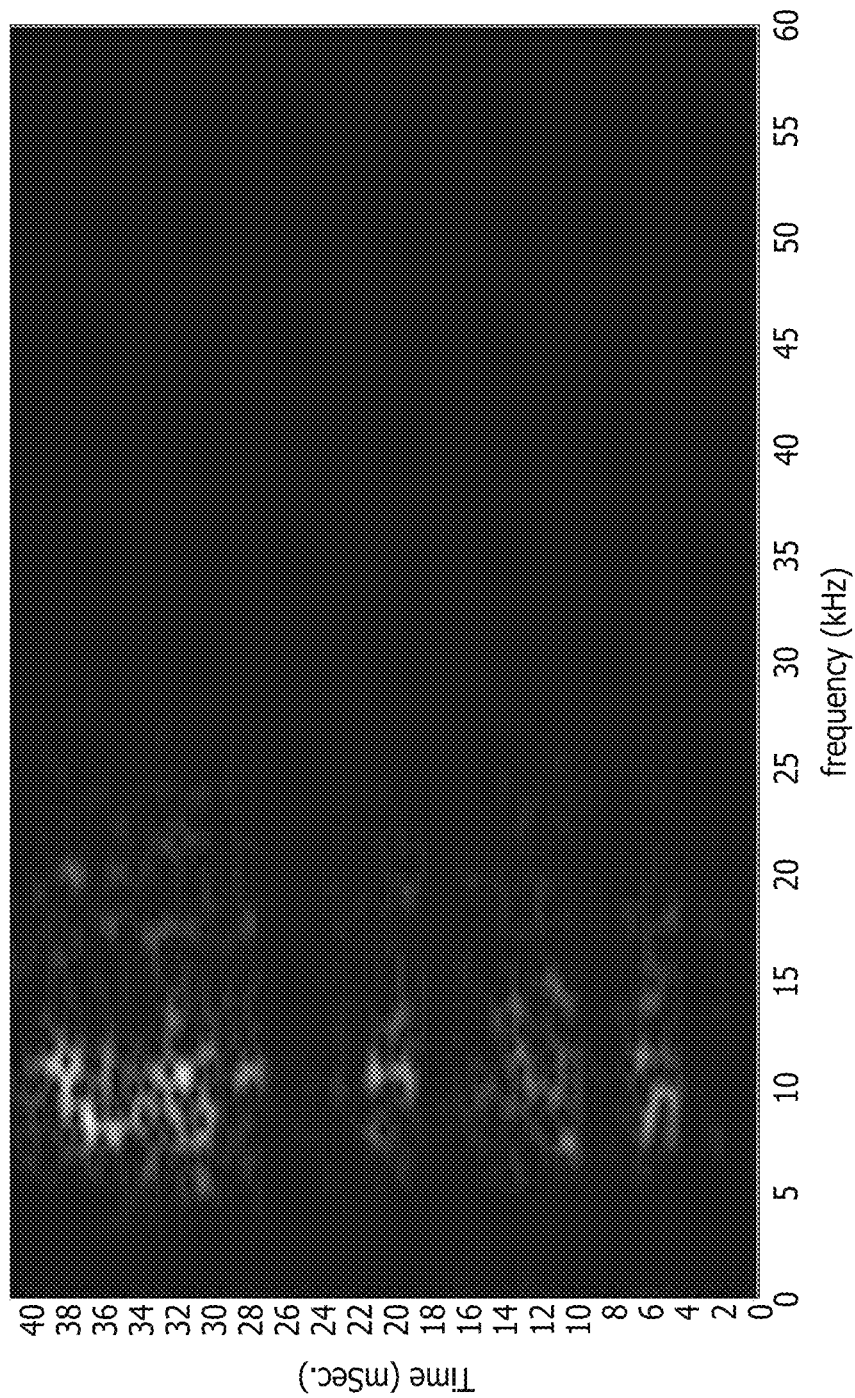
FIG. 23 is a gray-scale map of the power spectra of the cleave of the bonded wafer structure.
Figure 24:
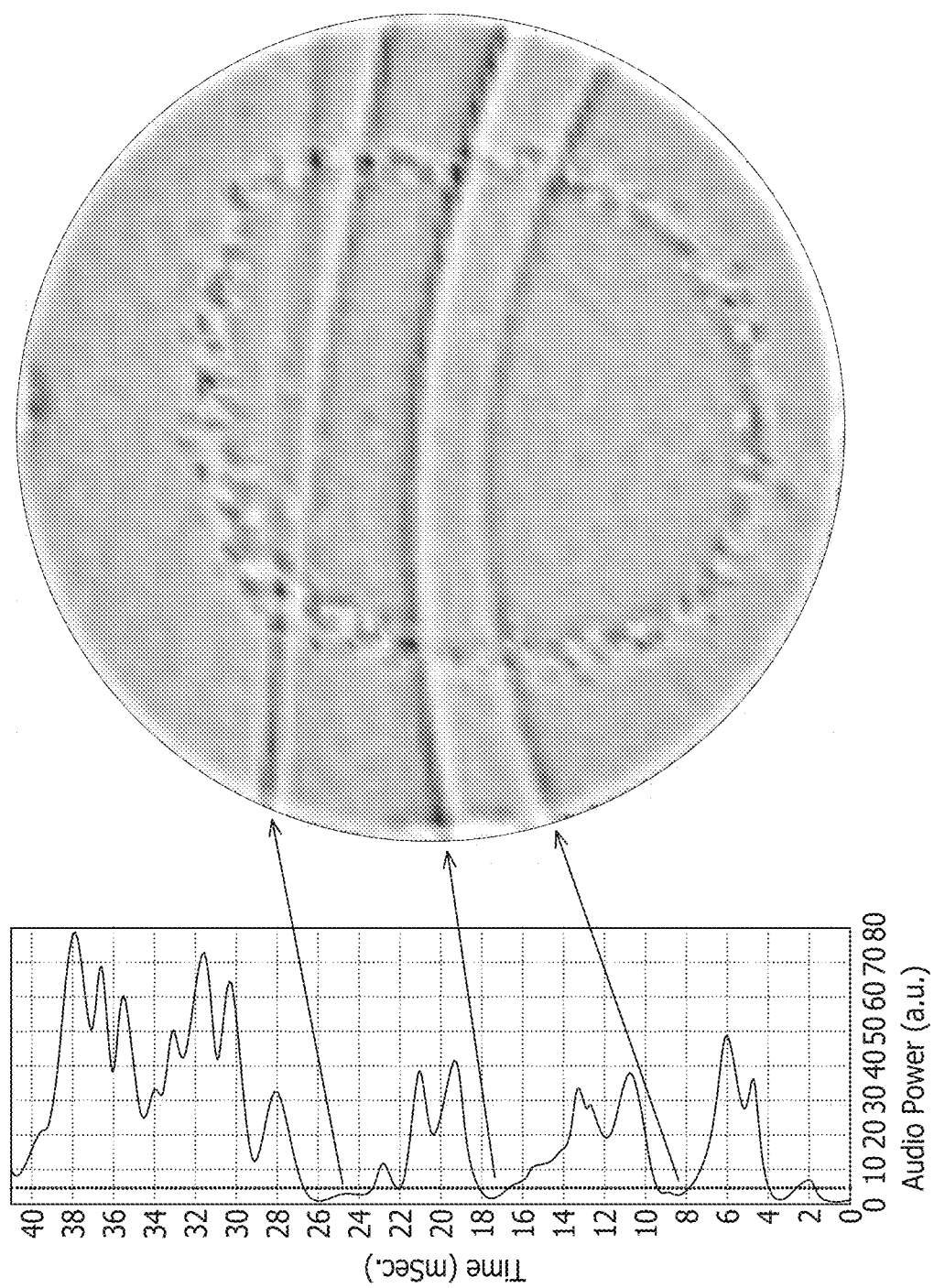
FIG. 24 is the power profile of another cleave of a bonded wafer structure with dips being correlated to thickness arcs of the filtered top silicon film thickness data map of the cleaved structure.

The power profile for a cleave which did not progress smoothly is shown in FIG. 22 with the gray-scale power spectra being shown in FIG. 23. FIG. 24 shows the power profile and the film thickness data map of the top silicon film thickness variation. The dips appear to be strongly correlated to top silicon arcs.

Example 2: Variation in Audio Metrics at Different Cleave Strains

Twenty-one 200 mm bonded wafer structures were cleaved with a mechanical cleaving device using suction cups and a blade to propagate the cleave. Seven wafers were processed with an initial strain according to a process of record (POR), seven were cleaved with a lower strain and seven cleaved with a higher strain than the process of record. Sound during cleaving was sensed by a microphone and a digitizer (max sampling frequency 216,000 Hz) was used to convert the signal to digital and the output was recorded. A photoelectric sensor positioned near the cleave arm was used to trigger the start of audio recording. A controller generated metrics from the audio power profile during the cleave. Calculated metrics included the delay between a cleave trigger and a start of cleave (Delay), duration of the cleave (Duration), mean power (P-mean), maximum power (P-max), frequency of maximum power (Freq P-Max), standard deviation of power (P-Sigma), magnitude of power oscillations (Power Osc.), amount of cleave time below dip threshold (Dip Time %), maximum single dip time (LongDip) and the number of power dips (Dips #). The metrics for each run are shown in Table 2 below.

TABLE 2

Audio Power Profile Metrics for Process of Record, Low Strain and High Strain Cleaves

| Category | Delay (mS) | Duration (mS) | P-Mean | P-Max | Freq-P-Max (kHz) |
|---|---|---|---|---|---|
| low strain | 2163.53 | 48.45 | 27.62 | 371.54 | 11.81 |
| low strain | 2267.63 | 38.35 | 30.91 | 286.29 | 10.97 |
| low strain | 2574.31 | 41.45 | 31.56 | 289.79 | 11.81 |
| low strain | 2198.66 | 41.15 | 30.21 | 277.15 | 10.97 |
| low strain | 2302.15 | 39.45 | 28.39 | 225.25 | 11.81 |
| low strain | 2107.13 | 46.25 | 19.99 | 232.27 | 10.97 |
| low strain | 2249.32 | 42.35 | 29.66 | 453.76 | 11.81 |
| high strain | 2564.36 | 32.25 | 41.96 | 255.47 | 11.81 |
| high strain | 2496.15 | 30.35 | 36.19 | 203.71 | 13.5 |
| high strain | 2436.99 | 30.85 | 39.14 | 212.72 | 10.97 |
| high strain | 2442.93 | 30.75 | 33.43 | 271.94 | 11.81 |
| high strain | 2490.36 | 30.65 | 34.12 | 215.01 | 10.97 |
| high strain | 2539.84 | 32.35 | 40.14 | 283.07 | 10.97 |
| high strain | 2562.66 | 30.35 | 38.93 | 229.85 | 11.81 |
| POR | 2453.78 | 37.55 | 33.08 | 237.08 | 12.66 |
| POR | 2252.08 | 37.85 | 35 | 277.64 | 11.81 |
| POR | 2234.94 | 35.85 | 28.95 | 253.86 | 11.81 |
| POR | 2336.81 | 35.65 | 30.92 | 277.93 | 12.66 |
| POR | 2216.2 | 35.95 | 33.66 | 285.63 | 12.66 |
| POR | 2217.07 | 36.45 | 39.88 | 235.48 | 12.66 |
| POR | 2171.4 | 37.65 | 36.59 | 231.82 | 11.81 |

| Category | P-Sigma | Power Osc. | DipTime % | LongDip (mS) | Dips # |
|---|---|---|---|---|---|
| low strain | 52.35 | 2233.65 | 24.53 | 7.4 | 4 |
| low strain | 50.01 | 1733.71 | 23.09 | 4.8 | 4 |
| low strain | 55.32 | 1985.73 | 14.89 | 5.9 | 4 |
| low strain | 56.14 | 2158.8 | 23.83 | 9.3 | 4 |
| low strain | 47.04 | 1806.36 | 18.99 | 7.9 | 2 |
| low strain | 43.44 | 2201.99 | 12.22 | 8.4 | 3 |
| low strain | 56.82 | 2352.46 | 19.93 | 4.8 | 5 |
| high strain | 57.45 | 2345.08 | 1.72 | 0.8 | 1 |
| high strain | 43.59 | 1880.28 | 2.68 | 1.2 | 1 |
| high strain | 52.6 | 1951.05 | 3.56 | 0.9 | 3 |
| high strain | 47.45 | 1664.59 | 5.33 | 1.6 | 2 |
| high strain | 43.55 | 1939.43 | 0.44 | 0.2 | 1 |
| high strain | 54.54 | 2521.9 | 3.88 | 0.8 | 3 |
| high strain | 48.09 | 2062.56 | 1.59 | 0.4 | 2 |
| POR | 46.46 | 2073.39 | 11.24 | 2.6 | 4 |
| POR | 48.35 | 2567.94 | 11.85 | 2.2 | 4 |
| POR | 40.39 | 1816.51 | 11.35 | 1.9 | 5 |
| POR | 47.87 | 1830.15 | 9.6 | 1.6 | 4 |
| POR | 50.42 | 2328.83 | 9.85 | 1.5 | 4 |
| POR | 58.17 | 2771.14 | 12.41 | 2.1 | 5 |
| POR | 52.45 | 2490.7 | 8.73 | 1.4 | 5 |

The calculated metrics indicated that lower strain resulted in a higher cleave duration and a higher strain resulted in a higher mean audio power. Low strain also produced the largest amount of dip time, number of dips and the longest dips while high strain produced the smallest of these metrics.

A film thickness data map of each wafer after cleaving was also generated. The data map was analyzed to view the number of cleave lines for each cleave. The lower strain cleaves exhibited less cleave lines. The metrics may be used to adjust the cleave (e.g., to adjust strain) to improve the uniformity of the cleave.

Example 3: Use of Cleave Audio to Detect a No-Layer-Transfer Condition

Figure 25:
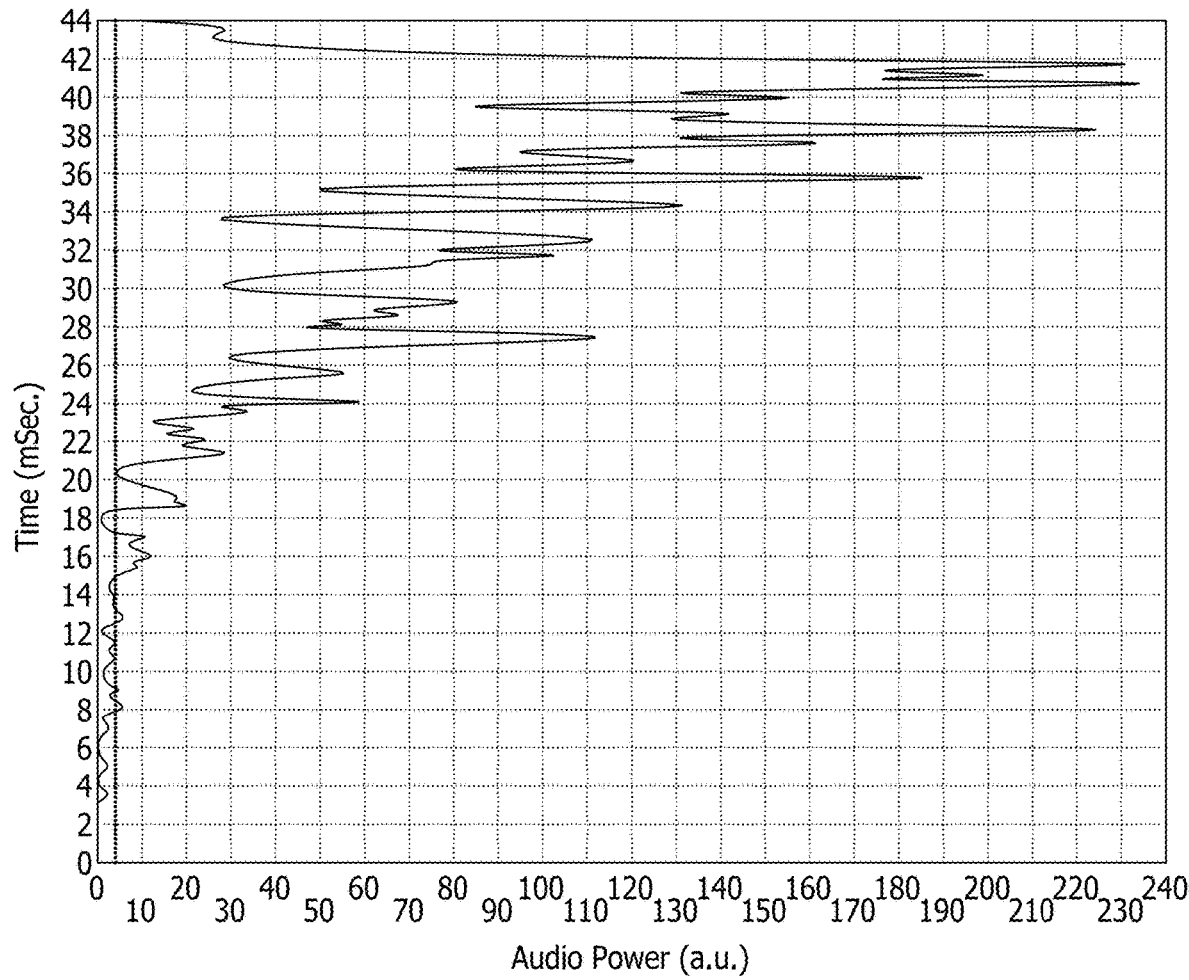
FIG. 25 is an audio power profile of a successful cleave.
Figure 26:
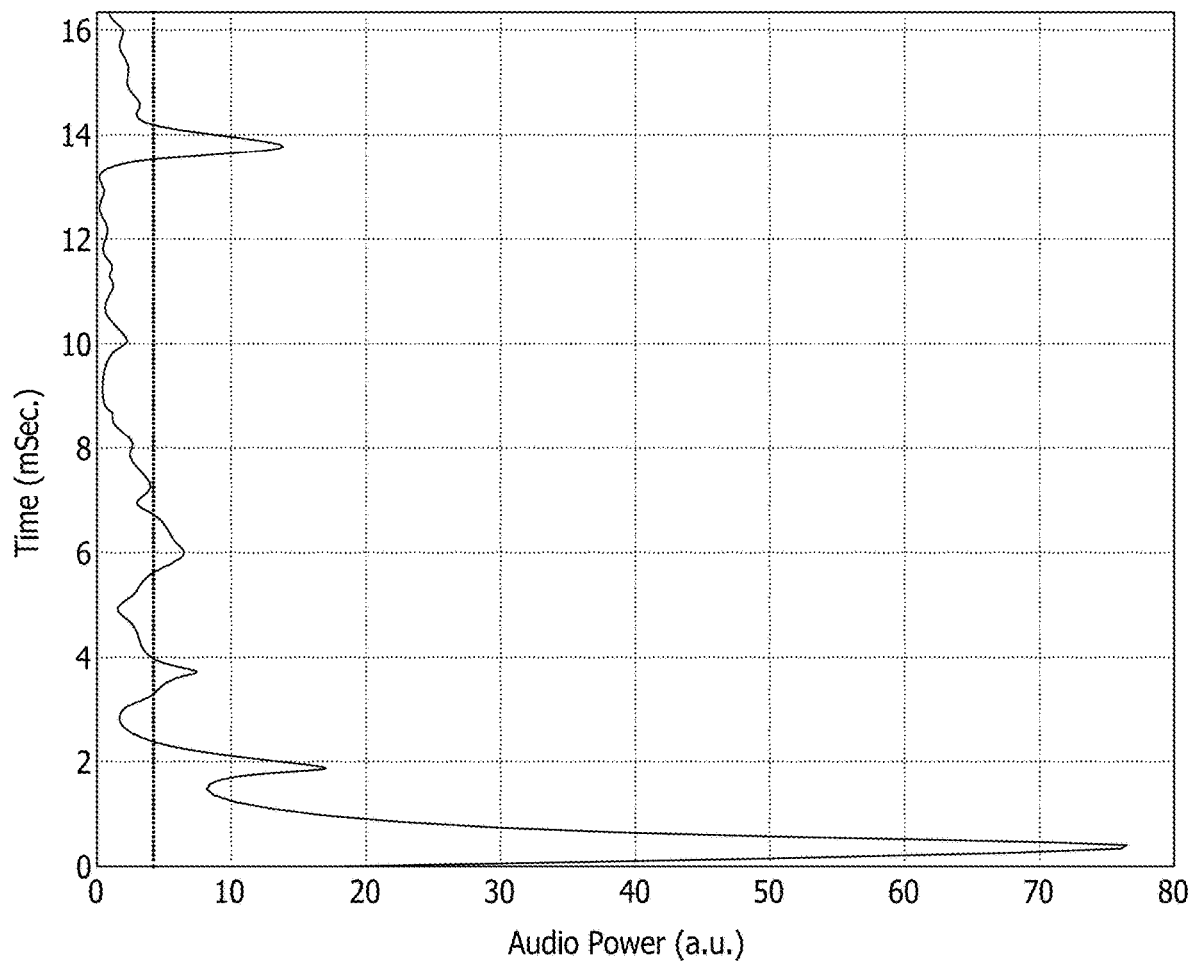
FIG. 26 is an audio power profile of a cleave in which the top silicon layer did not transfer.

The audio power profile of a cleave in which a device layer did not remain on the handle wafer (i.e., the entire donor wafer delaminated) was analyzed and compared to a typical cleave audio profile for a successful cleave. The successful cleave condition is shown in FIG. 25 and the unsuccessful cleave is shown in FIG. 26. As shown in FIG. 26, the audio power spiked and tapered to a low amount for the remainder of the cleave while the successful cleave of FIG. 25 exhibited an increase in power many seconds into the cleave (e.g., after about 20 seconds) and remained high until the cleave was complete. This indicates that observation of audio power profiles may be used to monitor the cleave of bonded wafer structures to determine when the device layer does not transfer for quality control purposes.

The difference in various audio profile metrics between successful transfer and no-layer-transfer were also observed and are shown in Table 3.

TABLE 3

Audio Power Profile Metrics for Successful Cleave and No Layer Transfer Cleaves

| Sample Size | Description | Delay (mS) | Duration (mS) | P-Mean | P-Max | Freq-P-Max (kHz) |
|---|---|---|---|---|---|---|
| 18570 | Successful Transfer | 2451.9 | 29.4 | 39.4 | 189.0 | 12.2 |
| 27398 | Successful Transfer | 3005.1 | 30.5 | 40.7 | 182.3 | 12.5 |
| 25 | No Transfer | 2545.5 | 19.9 | 2.8 | 81.8 | 0.0 |
| 25 | No Transfer | 2362.7 | 12.5 | 2.1 | 68.5 | 0.0 |

| Sample Size | Description | P-Sigma | Power Osc. | DipTime % | LongDip (mS) | Dips # |
|---|---|---|---|---|---|---|
| 18570 | Successful Transfer | 42.7 | 1899.8 | 2.8 | 1.1 | 1.2 |
| 27398 | Successful Transfer | 41.4 | 1843.6 | 5.0 | 1.6 | 1.5 |
| 25 | No Transfer | 7.6 | 264.1 | 28.8 | 7.4 | 4.2 |
| 25 | No Transfer | 6.5 | 189.5 | 1.2 | 5.4 | 0.4 |

As shown in Table 3, the no-layer-transfer cleaves had significantly lower mean power, maximum power, frequency of maximum power, standard deviation of power and magnitude of power oscillations. These metrics may be used as a quality control for the cleaving process.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for separating bonded wafer structures, the method comprising:
   cleaving a bonded wafer structure, wherein cleaving a bonded wafer structure comprises separating a first structure from a second structure by a mechanical cleave process in which separation occurs by propagation from a leading edge of the boned wafer structure toward a trailing edge opposite from the leading edge;
   sensing sound emitted from the bonded wafer structure while separating the first structure from the second structure by the mechanical cleave process; and
   generating a metric related to an attribute of the cleave based on sound sensed while separating the first structure from the second structure by the mechanical cleave process.

2. The method as set forth in claim 1 comprising adjusting a cleave control parameter to improve the quality of the cleave of subsequently cleaved bonded wafer structures.

3. The method as set forth in claim 1 wherein the metric is derived from an audio power profile generated during the cleave.

4. The method as set forth in claim 3 wherein the metric is selected from the group consisting of delay between a cleave trigger and a start of cleave, duration of the cleave, mean power, maximum power, frequency at which maximum power occurs, standard deviation of power, magnitude of power oscillations, amount of cleave time below a threshold power, maximum single dip time below a threshold power and the number of power dips below a threshold power.

5. The method as set forth in claim 1 comprising detecting when a cleave sequence has commenced for cleaving the bonded wafer structure, wherein sound is sensed upon detecting that the cleave sequence has commenced.

6. The method as set forth in claim 1 comprising converting sensed sound into data, the metric related to an attribute of the cleave being based on the data.

7. The method as set forth in claim 1 wherein generating a metric related to an attribute of the cleave based on sensed sound comprises generating a power function by a fast Fourier transform algorithm.

8. The method as set forth in claim 7 wherein the algorithm is a stepped fast Fourier transform algorithm.

9. The method as set forth in claim 1 wherein the generating a metric related to an attribute of the cleave based on sensed sound comprises generating a power function by digital filtering.

10. The method as set forth in claim 1 wherein the mechanical cleave process comprises a blade or mechanical wedge at the leading edge of the bonded wafer structure to propagate the cleave.

11. A cleave system for separating a bonded wafer structure, the system comprising:
    a cleaving device for cleaving the bonded wafer structure along a cleave plane, the cleaving device comprising one or more suction cups for applying a mechanical force to the bonded wafer structure to cleave the bonded wafer structure;
    an acoustic sensor for sensing sound emitted from the bonded wafer structure during cleaving and to generate an output in response to the sensed sound; and
    a controller configured to generate a metric related to an attribute of the cleave based at least in part on the output of the acoustic sensor.

12. The cleave system as set forth in claim 11 wherein the metric is derived from an audio power profile generated during the cleave.

13. The cleave system as set forth in claim 11 wherein the cleaving device is a mechanical cleaving device configured to produce a propagated cleave of the bonded wafer structure.

14. The cleave system as set forth in claim 11 wherein the cleaving device is a thermal cleaving device.

15. The cleave system as set forth in claim 11 further comprising a trigger sensor for detecting when a cleave sequence has commenced for cleaving the bonded wafer structure.

16. The cleave system as set forth in claim 11 further comprising an analog-to-digital converter for converting sound sensed by the acoustic sensor into data, the metric related to an attribute of the cleave generated by the controller being based at least in part on the data generated by the analog to digital converter.

17. The cleave system as set forth in claim 16 wherein the analog-to-digital converter comprises a digitizer or a sound card.

18. The cleave system as set forth in claim 11 wherein the controller is configured to generate 2 or more metrics related to attributes of the cleave based at least in part on the output of the acoustic sensor.

19. The cleave system as set forth in claim 11 wherein the cleaving device comprises a blade or mechanical wedge to propagate the cleave at an edge of the bonded wafer structure.

* * * * *